(12) United States Patent
Osternack et al.

(10) Patent No.: US 10,457,231 B2
(45) Date of Patent: Oct. 29, 2019

(54) ELECTRONICS INSTALLATION SYSTEM, AIRCRAFT OR SPACECRAFT, AND METHOD

(71) Applicant: Airbus Operations GmbH, Hamburg (DE)

(72) Inventors: Stefan Osternack, Hamburg (DE); Nicholas E. Brownjohn, Hamburg (DE); Poulain Stéphane, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 375 days.

(21) Appl. No.: 14/946,310

(22) Filed: Nov. 19, 2015

(65) Prior Publication Data

US 2016/0229361 A1    Aug. 11, 2016

(30) Foreign Application Priority Data

Nov. 21, 2014    (EP) .................................... 14194271

(51) Int. Cl.
| | |
|---|---|
| B60L 1/00 | (2006.01) |
| H01R 29/00 | (2006.01) |
| B60R 16/03 | (2006.01) |
| H05K 7/14 | (2006.01) |
| G02B 6/44 | (2006.01) |

(52) U.S. Cl.
CPC ............ B60R 16/03 (2013.01); G02B 6/4452 (2013.01); H05K 7/1428 (2013.01); H05K 7/1457 (2013.01); H05K 7/1459 (2013.01)

(58) Field of Classification Search
CPC .............................. B60R 16/03; G02B 6/4452
USPC ............................................ 307/9.1; 439/189
See application file for complete search history.

(56) References Cited

U.S. PATENT DOCUMENTS

| | | | | |
|---|---|---|---|---|
| 5,130,893 | A * | 7/1992 | Straate ..................... | H02G 3/00 361/728 |
| 8,107,256 | B1 * | 1/2012 | Kondrat ............... | H05K 7/1429 361/788 |
| 2003/0016520 | A1 | 1/2003 | Cooney et al. | |
| 2012/0203401 | A1 * | 8/2012 | Dunsdon ............ | H04B 7/18506 701/3 |
| 2013/0107879 | A1 * | 5/2013 | Goldstein ............... | G06F 1/181 370/386 |

FOREIGN PATENT DOCUMENTS

| | | |
|---|---|---|
| FR | 2927222 A1 | 8/2009 |
| FR | 2977447 A1 | 1/2013 |

OTHER PUBLICATIONS

European Patent Office, Extended European Search Report for European Patent Application No. 14194271.4 dated Apr. 30, 2015.

* cited by examiner

Primary Examiner — Rexford N Barnie
Assistant Examiner — Dru Parries
(74) Attorney, Agent, or Firm — Lorenz & Kopf LLP

(57) ABSTRACT

An electronics installation system, especially for an aircraft or spacecraft, includes at least one mechanical installation structure having a plurality of installation slots each configured to receive an electronic module and at least one wiring configuration slot configured to receive a wiring configuration module, and a connection matrix comprising a plurality of data connections, wherein at least one data connection is provided between each one of the installation slots and at least one wiring configuration slot.

9 Claims, 3 Drawing Sheets

ELECTRONICS INSTALLATION SYSTEM, AIRCRAFT OR SPACECRAFT, AND METHOD

CROSS-REFERENCE TO RELATED APPLICATION

This application claims priority to European Patent Application No. 14194271.4, filed Nov. 21, 2014, which is incorporated herein by reference in its entirety.

TECHNICAL FIELD

The embodiments described herein relate to an electronics installation system, especially for an aircraft or spacecraft. Furthermore, the embodiment relates to an aircraft or spacecraft and a method for installing electronics, especially in an aircraft or spacecraft.

BACKGROUND

Although applicable to any system that makes use of modular electronics which can be swapped out as needed, the embodiments will be described in combination with electronic systems in aircrafts.

In modern aircraft, a plurality of electronic devices are used for a plurality of different tasks ranging from aircraft control to passenger entertainment.

For example, electronic devices can be used for control of rudders, flaps, and the like. Furthermore, electronic devices can be used for cabin lighting, passenger information, and the like. Further applications of electronic devices in an aircraft include infotainment systems and other passenger services like on board internet access.

In today's aircraft, most electronic systems each comprise their own data transmission means based on separate copper wire based data networks. Such system architecture leads to a complex aircraft network with a high total weight. Furthermore, such system architectures lack modularity and flexibility in terms of upgrading, updating or reconfiguring the system. In order to install such a system architecture in an electronics bay or a cabinet of an aircraft a long, complex, and highly iterative installation process is necessary.

Current electronics bay monument solutions in mobile platforms like e.g. civil airliners require prior knowledge of where electronic equipment, e.g. type ARINC 600 or ARINC 836, are to be located within the monument as well as knowledge of the interconnectivity between neighbouring equipment before the complex electronics bay monument wiring can be defined and installed.

Accordingly, there is a need for providing more flexible system architectures for an aircraft or spacecraft.

In addition, other objects, desirable features and characteristics will become apparent from the subsequent summary and detailed description, and the appended claims, taken in conjunction with the accompanying drawings and this background.

SUMMARY

According to the embodiment, an electronics installation system, especially for an aircraft or spacecraft, comprises at least one mechanical installation structure comprising a plurality of installation slots each configured to receive an electronic module and at least one wiring configuration slot con-figured to receive a wiring configuration module, and a connection matrix comprising a plurality of data connections, wherein at least one data connection is provided between each one of the installation slots and at least one wiring configuration slot.

According to the embodiment, an aircraft or spacecraft comprises at least one electronics installation system according to the embodiment, and at least one electronic module configured to provide a predefined function in the aircraft or spacecraft, wherein the at least one electronic module is installed in an installation slot of a mechanical installation structure of the electronics installation system.

According to the embodiment, a method for installing electronics, especially in an aircraft or spacecraft, comprises providing a plurality of installation slots each configured to receive an electronic module and at least one wiring configuration slot configured to receive a wiring configuration module in at least one mechanical installation structure, providing a plurality of data connections, wherein at least one data connection is provided between each one of the installation slots and at least one wiring configuration slot.

In accordance with an embodiment, a highly standardized, easily reconfigurable electronics installation system is created for the installation of electronic equipment especially in an aircraft or spacecraft, without the disadvantages of the complex customized wiring associated with today's solutions.

The wiring between equipment locations or installation slots remains unchanged, regardless of which equipment is installed in the respective location or installation slot.

Equipment or electronic module interconnection re-configuration is achieved by exchanging wiring configuration modules located in pre-defined locations or wiring configuration slots within the mechanical installation structure, e.g. the monument or electronics bay of the respective aircraft or spacecraft.

Each installation slot has at least one data connection or channel for data transmission. These data connections are routed from each installation slot, via a connection matrix to at least one wiring configuration module installed in the mechanical installation structure in specific wiring configuration slots. This wiring configuration module can be exchanged in case alternative interconnectivity between equipment inside the mechanical installation structure is needed. This approach allows the same mechanical installation structure to be used on all aircraft of the same type, regardless of aircraft systems fit or configuration.

In one embodiment, the connection matrix comprises a flexible circuit. A flexible circuit or flexi circuit provides connections between the different slots in the mechanical installation structure with little added weight.

In a further possible embodiment, the connection matrix comprises a printed circuit board. The printed circuit board allows providing rigid and robust data connections.

In a further possible embodiment, the connection matrix is embedded in the mechanical installation structure. Integration of the connection matrix in the mechanical installation structure allows hiding the data connections, which provides a clean mechanical installation structure with little complexity.

In a further possible embodiment, the data connections comprise optical fibre connections. Optical fibre connections allow transmitting data at a high bandwidth.

In a still further possible embodiment, the data connections comprise electrically conductive connections. By using electrically conductive connections existing equipment can easily be integrated in the electronics installation system.

In a further possible embodiment, the mechanical installation structure comprises at least two wiring configuration slots. Furthermore, the connection matrix comprises at least one data connection between the at least two wiring configuration slots. This allows providing separate and/or redundant networks in the electronics installation system.

In a still further possible embodiment, the mechanical installation structure comprises at least one power supply slot. Furthermore the connection matrix comprises power lines configured to connect each one of the installation slots and each one of the configuration slots with at least one of the power supply slots. Integrating the power supply into the mechanical installation structure and the connection matrix allows providing a compact electronics installation system.

In yet a further possible embodiment, the power lines comprise a power bus configured to connect a plurality of the installation slots and/or the configuration slots with at least one of the power supply slots. Providing a power bus further reduces system complexity.

In a still further possible embodiment, the power bus comprises at least on protection unit configured to protect the power bus in case of a failure of an electronic module and/or a wiring configuration module. This allows further providing electric power to electronic modules or wiring configuration modules even if one of the electronic modules or wiring configuration modules fails and e.g. short circuits the power bus.

In a further possible embodiment, the electronics installation system comprises at least one power supply unit installed in one of the power supply slots and coupled to the power lines and configured to provide electrical power via the power lines. Providing the power supply units in the mechanical installation structure allows providing a compact and light weight system.

In another possible embodiment, the electronics installation system comprises at least one wiring configuration module installed in one of the configuration slots and coupled to the data connections of the respective configuration slot, the wiring configuration module comprising internal interconnection paths providing data communication between at least one data connection of the respective wiring configuration slot and at least one other data connection of the respective wiring configuration slot. In one embodiment the wiring configuration module comprises an ARINC 836 interconnection-box. This allows flexibly interconnecting different data connections of different installation slots and thereby providing a direct data connection between said installation slots.

In a further possible embodiment, the at least one wiring configuration module comprises static and/or predefined internal interconnection paths. This allows providing a wiring configuration module of low complexity which can simply be exchanged for another wiring configuration module if the interconnections of the data connections have to be changed.

In a still further possible embodiment, the at least one wiring configuration module comprises configurable internal interconnection paths configurable to interconnect specific data connections in the respective configuration slot. This allows flexibly adapting the interconnections between the data connections without exchanging the wiring configuration module.

BRIEF DESCRIPTION OF THE DRAWINGS

The various embodiments will hereinafter be described in conjunction with the following drawing figures, wherein like numerals denote like elements, and.

The accompanying drawings are included to provide a further understanding of the embodiments and are incorporated in and constitute a part of this specification. The drawings illustrate the embodiments and together with the description serve to explain the principles of the invention. Other embodiments and many of the intended advantages will be readily appreciated as they become better understood by reference to the following detailed description. The elements of the drawings are not necessarily drawn to scale relative to each other. In the figures, like reference signs denote like elements unless stated otherwise.

DETAILED DESCRIPTION

The following detailed description is merely exemplary in nature and is not intended to limit the disclosed embodiments or the application and uses thereof. Furthermore, there is no intention to be bound by any theory presented in the preceding background detailed description.

Figure 1:
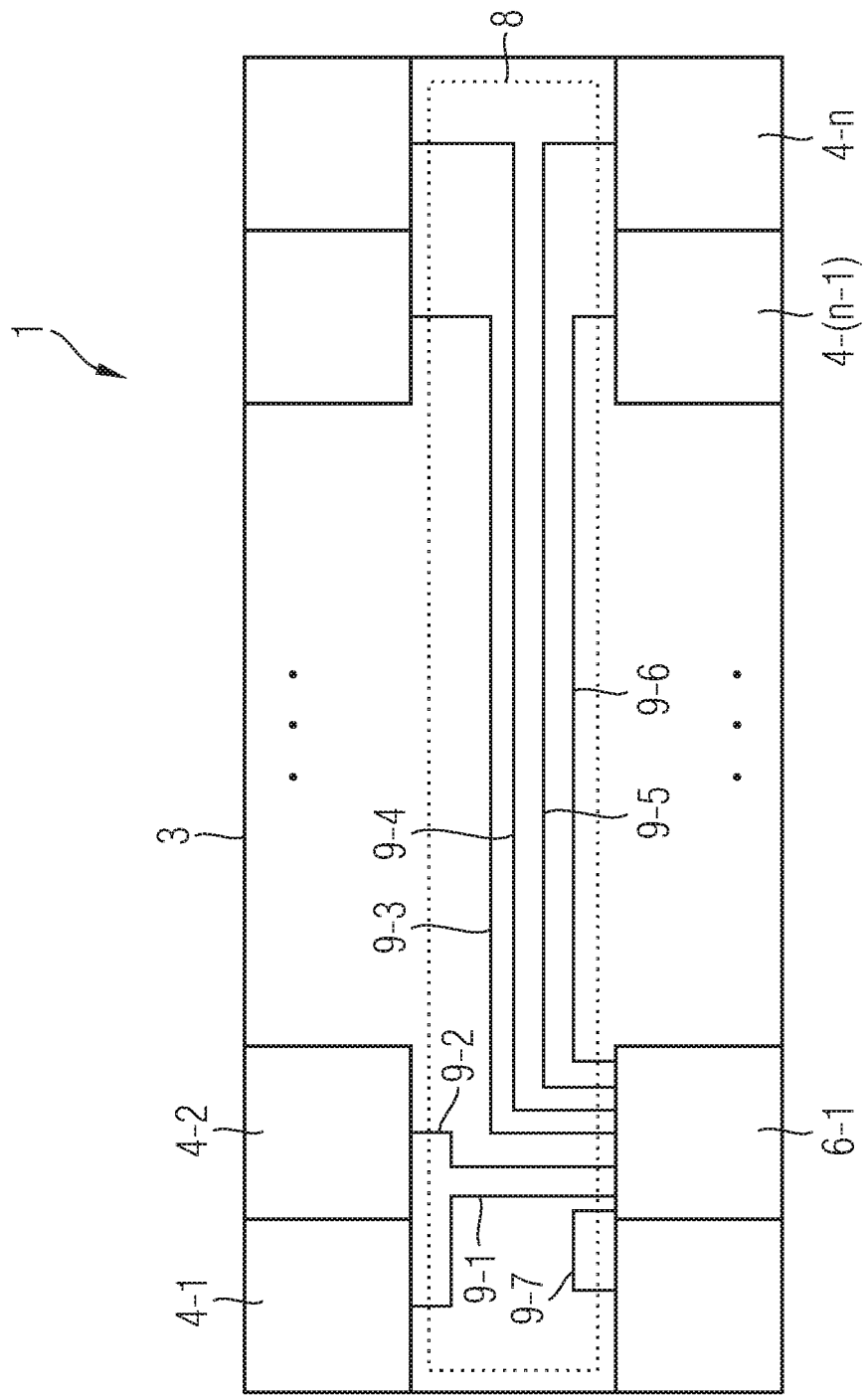
FIG. 1 shows a block diagram of an exemplary embodiment of an electronics installation system.

FIG. 1 shows a block diagram of an exemplary embodiment of an electronics installation system 1 according to the embodiment.

The electronics installation system 1 of FIG. 1 comprises a mechanical installation structure 3 that is shown as a square structure comprising a plurality of installation slots 4-1-4-n. Two of the installation slots are shown in each one of the corners of the mechanical installation structure 3, and only the two installation slots 4-1-4-2 in the upper left corner of the mechanical installation structure 3 and the two installation slots 4-(n-1) and 4-n in the lower right corner of the mechanical installation structure 3 are provided with reference signs for sake of clarity. Further, installation slots 4-1-4-n are indicated by three dots between the upper installation slots and by three dots between the lower installation slots. The second slot 6-1 in the lower left corner is not configured as an installation slot 4-1-4-n but as a wiring configuration slot 6-1.

A slot in this context refers to a location or a space in the mechanical installation structure 3 where a module can be installed. To this end, a slot can comprise every necessary installation aid, like e.g. mechanical fixation elements or electric connection means. A slot can, for example, comprise snap in fixation elements which fix a module in its position once inserted in to the slot. Furthermore, a slot can comprise connectors or plugs, which automatically slide into the respective counterpart in a module when the module is inserted into the slot. In one embodiment, a slot can comprise rails or guides which allow sliding a module into the respective slot and automatically position the module in the slot such that the mechanical fixation elements and the plugs or connectors rest in the correct position.

The difference between the installation slots 4-1-4-n and the wiring configuration slot 6-1 is determined by the connection matrix 8, which in FIG. 1 comprises seven data connections 9-1-9-7. Each one of the data connections 9-1-9-7 connects one of the installation slots 4-1-4-n with the wiring configuration slot 6-1. Consequently, the wiring configuration slot 6-1 is coupled with every single one of the installation slots 4-1-4-n by a data connection 9-1-9-7. In another embodiment the mechanical installation structure 3 can comprise more than one wiring configuration slot 6-1.

The connection matrix 8 can be a structure which is added to the mechanical installation structure 3 and which comprises the respective data connections 9-1-9-7. For example, the connection matrix 8 can be a flexible circuit or flexi circuit, which includes optical fibres or conductive traces like copper traces. In one embodiment the connection matrix 8 can at least partially comprise a printed circuit board, for example, a FR4-based printed circuit board. In addition or alternatively, the connection matrix 8 can be at least partially integrated into the mechanical installation structure 3. In such an embodiment the respective data connections 9-1-9-7 would be integrated e.g. in a frame of the mechanical installation structure 3, or the like.

In FIG. 1, one single data connection 9-1-9-7 is shown connecting the installation slots 4-1-4-n with the wiring configuration slot 6-1 just as an example. In one embodiment every single data connection 9-1-9-7 can comprise a plurality of single physical data lines. For example, in one embodiment a single data connection 9-1-9-7 can comprise more than fifty optical fibres, e.g. 100 optical fibres. In another embodiment in addition or as an alternative every single data connection 9-1-9-7 can comprise conductive data lines, like e.g. copper wires or copper traces on a printed circuit board or a flexible circuit.

The mechanical installation structure 3 can e.g. be embodied as an electronics bay or monument of an aircraft 2 or spacecraft. In an aircraft 2, such an electronics bay can be installed in the fuselage of the aircraft 2 and accommodates a plurality of electronic modules 5-1-5-n, which each provide specific functions in the aircraft. Such functions can e.g. be related to the manoeuvring of the aircraft 2, cabin functions of the aircraft 2, like e.g. lightning and climate control, passenger entertainment and information or the like.

In order to provide the functions the single electronic modules 5-1-5-n need to be connected to other electronic modules 5-1-5-n via data connections 9-1-9-7. These interconnections between the single electronic modules 5-1-5-n can be provided by a wiring configuration module 7-1-7-2 (see FIG. 4), which in the wiring configuration slot 6-1 internally interconnects predefined data connections 9-1-9-7 to each other and therefore provides direct data transmission between the respective electronic modules 5-1-5-n or forms data networks or data busses.

Accordingly, with the embodiment, it becomes possible to change a wiring configuration of an electronics bay of e.g. an aircraft simply by adapting the internal interconnections of a wiring configuration module 7-1-7-2.

For example, if a new electronics module 5-1-5-n is added to the mechanical installation structure 3 into a spare installation slot 4-1-4-n a data connection 9-1-9-7 is already provided in the installation slot 4-1-4-n. Therefore, to connect the newly added electronics module 5-1-5-n to a network or another electronics module 5-1-5-n, the respective wiring configuration module 7-1-7-2 has to be adapted to interconnect the data connection 9-1-9-7 of the newly added electronics module 5-1-5-n to the required data connection 9-1-9-7.

This could, for example, be achieved by swapping out the entire wiring configuration module 7-1-7-2 in the respective wiring configuration slot 6-1-6-2. As an alternative, the wiring configuration module 7-1-7-2 could comprise configurable internal interconnection paths 17-1-17-3 (see FIG. 4) which can be changed and adapted without removing or exchanging the wiring configuration module 7-1-7-2.

Figure 2:
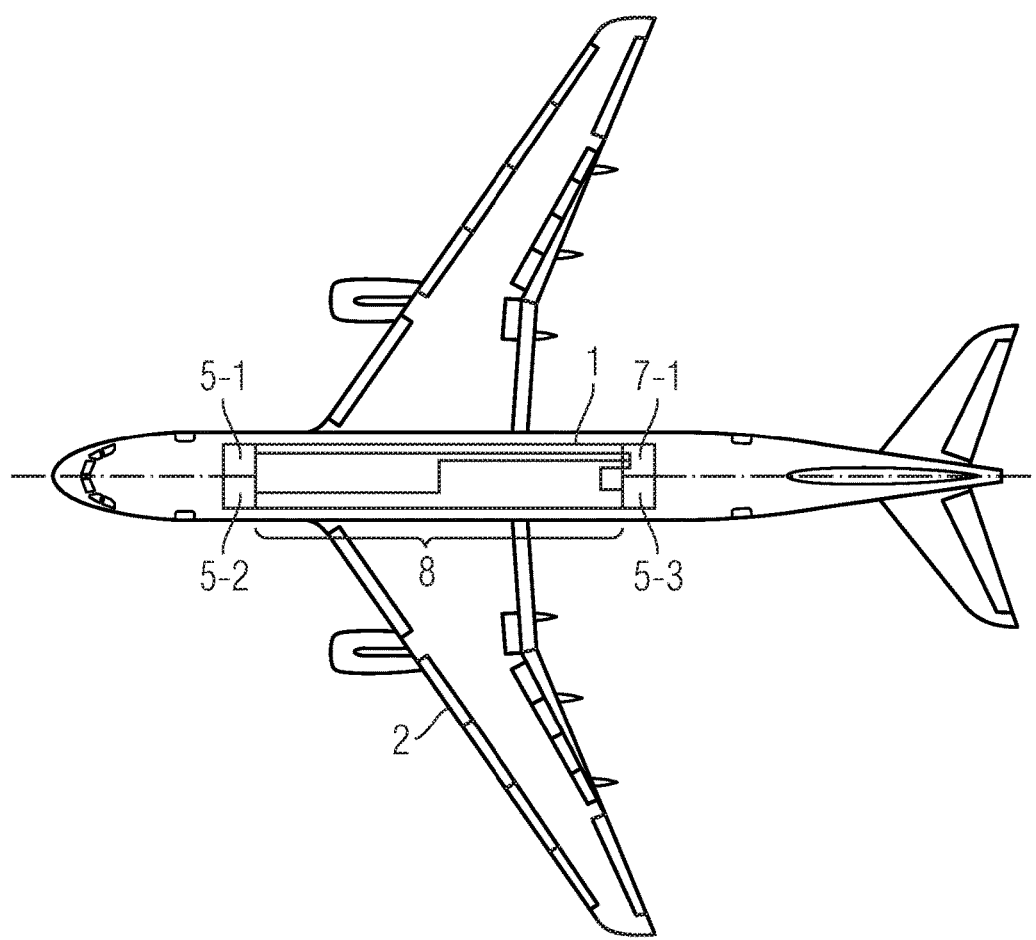
FIG. 2 shows a block diagram of an exemplary embodiment of an aircraft.

FIG. 2 shows a block diagram of an exemplary embodiment of an aircraft 2 according to a further embodiment.

The aircraft 2 of FIG. 2 is a jet-type aircraft with two turbines, one on each wing. This type of aircraft 2 is just an exemplary selection. It is apparent that the embodiment can be used with any type of aircraft. In fact the embodiment can also be used with other applications, like e.g. trains, busses, or other vehicles.

In FIG. 2, the aircraft comprises an electronics installation system 1 according to an embodiment, which is only shown as an abstract block diagram for ease of understanding. The electronics installation system 1 comprises a mechanical installation structure (not explicitly shown) with one wiring configuration slot and three installation slots, which are not explicitly provided with reference signs for sake of simplicity. In the installation slots electronic modules 5-1-5-7 are provided, which are connected by data connections with a wiring configuration module 7-1 in the wiring configuration slot. In the wiring configuration module 7-1 all data connections are coupled together to form a data bus.

The number and arrangement of the electronic modules 5-1-5-7 and the wiring configuration module 7-1 in FIG. 2 is just exemplary and used to illustrate the concept of the embodiment. In other embodiments more or less electronic modules 5-1-5-7 or more wiring configuration modules can be installed in the mechanical installation structure 3.

Furthermore, an aircraft 2 can comprise more than one electronics installation system 1. For example, a plurality of electronics installation systems 1 can be distributed throughout the fuselage of the aircraft 2. The distributed electronics installation systems 1 can be coupled to each other by high speed data connections to provide data communication between the electronic modules 5-1-5-n installed in different electronics installation systems 1.

As already mentioned above, the term data connection refers to all kinds of data connections ranging from single optical or conductive data lines or traces to a plurality of optical or conductive data lines or traces which can be combined into one data connection.

Figure 3:
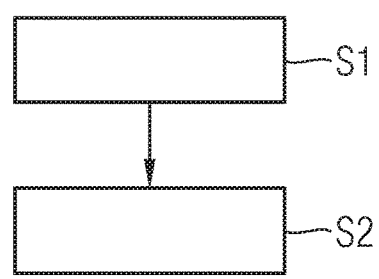
FIG. 3 shows a flow diagram of an exemplary embodiment of a method according to the embodiment.

FIG. 3 shows a flow diagram of an exemplary embodiment of a method according to an embodiment.

The method comprises providing S1 a plurality of installation slots 4-1-4-n each configured to receive an electronic module 5-1-5-7 and at least one wiring configuration slot 6-1-6-2 configured to receive a wiring configuration module 7-1-7-2 in at least one mechanical installation structure 3. The method further comprises providing S2 a plurality of data connections 9-1-9-14, wherein at least one data connection 9-1-9-14 is provided between each one of the installation slots 4-1-4-n and at least one wiring configuration slot 6-1-6-2.

The data connections 9-1-9-14 can be provided as single optical or conductive data lines or traces or a plurality of optical or conductive data lines or traces which can be combined into one data connection 9-1-9-14. Furthermore, the data connections can be provided as a connection matrix 8, which can be integrated into the structure of the mechanical installation structure 3. Alternatively, the connection matrix 8 can be provided as a flexible circuit, a printed circuit board or the like.

In one embodiment, the method comprises installing at least one wiring configuration module 7-1-7-2 in one of the configuration slots and coupling the at least one wiring configuration module 7-1-7-2 to the data connections 9-1-9-14 of the respective configuration slot, the wiring configuration module 7-1-7-2 comprising internal interconnection paths 17-1 - 17-3 providing data communication between at least one data connection 9-1-9-14 of the respective configuration slot and at least one other data connection 9-1-9-14 of the respective configuration slot.

In order to provide redundant data connections in one embodiment at least two wiring configuration slots 6-1-6-2 are provided. Furthermore, at least one data connection 9-1-9-14 is provided between the at least two wiring configuration slots 6-1-6-2.

In such an embodiment, a data connection 9-1-9-14 can be provided in the connection matrix 8 from every single one of the installation slots 4-1-4-n to each one of the wiring configuration slots 6-1-6-2.

In order to supply electric power to the single electronic modules 5-1-5-7 or the wiring configuration modules 7-1-7-2 at least one power supply slot 12-1-12-2 can be provided in the mechanical installation structure 3. Furthermore power lines 13-1-13-4 can be provided connecting at least one of the installation slots 4-1-4-n and/or at least one of the wiring configuration slots 6-1-6-2 with at least one of the power supply slots 12-1-12-2.

In one embodiment, at least one power supply unit 16-1-16-2 is installed in one of the power supply slots 12-1-12-2 and coupled to the power lines 13-1-13-4.

In one embodiment, to reduce the complexity of the power distribution section of the electronics installation systems 1 the power lines 13-1-13-4 are provided in a power bus 14-1-14-2 configured to connect a plurality of the installation slots 4-1-4-n and/or the wiring configuration slots 6-1-6-2 with at least one of the power supply slots 12-1-12-2.

To protect the modules supplied by a power bus 14-1-14-2 from a failure of a single module in one embodiment, at least one protection unit 15 configured to protect the power bus 14-1-14-2 in case of a failure of an electronic module 5-1-5-7 and/or a wiring configuration module 7-1-7-2 is provided with the power bus 14-1-14-2.

The protection unit 15 can, for example, be adapted to separate an electronic module 5-1-5-7 and/or a wiring configuration module 7-1-7-2 from the power bus 14-1-14-2 if the respective electronic module 5-1-5-7 and/or wiring configuration module 7-1-7-2 short circuits the power lines 13-1-13-4 of the respective power bus 14-1-14-2.

Figure 4:
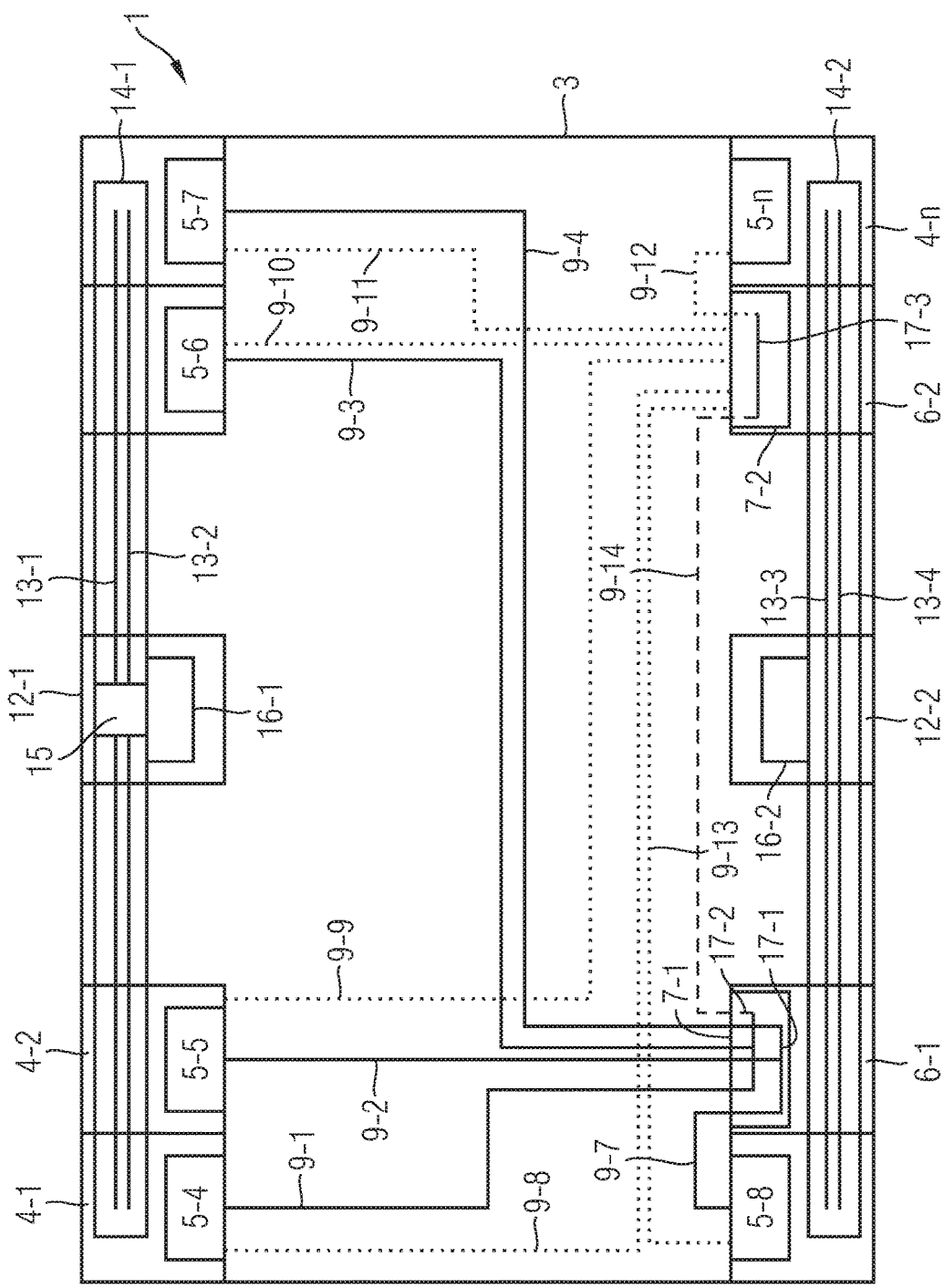
FIG. 4 shows a block diagram of another exemplary embodiment of an electronics installation system.

FIG. 4 shows a block diagram of another exemplary embodiment of an electronics installation system 1 according to an embodiment.

The electronics installation system 1 of FIG. 4 is based on the electronics installation system 1 of FIG. 1.

In contrast to FIG. 1, the electronics installation system 1 of FIG. 4 comprises electronic modules 5-4-5-n installed in the installation slots 4-1-4-n. Furthermore, the electronics installation system 1 comprises two wiring configuration slots 6-1, 6-2. The first wiring configuration slot 6-1 is provided in the second slot in the lower left corner of the mechanical installation structure 3 and the second wiring configuration slot 6-2 is provided in the first slot in the lower right corner of the mechanical installation structure 3.

Furthermore, in addition to the data connections 9-1-9-7, the interconnection matrix 8 (not explicitly indicated) of FIG. 4 comprises further data connections 9-8-9-13, which connect every installation slot 4-1-4-n to the second wiring configuration slot 6-2. Furthermore a data connection 9-14 interconnects the wiring configuration slots 6-1, 6-2.

In the wiring configuration slots 6-1, 6-2, a first wiring configuration module 7-1 and a second wiring configuration module 7-2 are provided, respectively, which interconnect specific data connections 9-1-9-14.

The electronic modules 5-1-5-n and the wiring configuration modules 7-1, 7-2 shown in FIG. 4 are just exemplary. It should be understood that specific slots in the mechanical installation structure 3 can be left unequipped and reserved for future upgrading.

The first wiring configuration module 7-1 comprises internal interconnection paths 17-1 and 17-2. Internal interconnection path 17-1 interconnects data connections 9-7, 9-2, and 9-4. Internal interconnection path 17-2 interconnects data connections 9-1, 9-3, and 9-14.

The second wiring configuration module 7-2 comprises internal interconnection path 17-3, which interconnects data connections 9-14 and 9-13.

It can be seen in the second wiring configuration module 7-2 that the data connections 9-8-9-11 are routed to the wiring configuration slot 6-2 even though they are not connected to any other data connection 9-1-9-14 by the second wiring configuration module 7-2. But in case the electronic modules 5-1-5-n are updated or modified or in case new electronic modules are added to the electronic installation system 1 data connections can easily be provided by amending the first and second wiring configuration modules 7-1, 7-2.

In further embodiments, more than two wiring configuration modules 7-1, 7-2 can be provided. Especially, fully redundant network topologies can be provided by providing two wiring configuration modules 7-1, 7-2 for each network. Also, one wiring configuration module 7-1, 7-2 can connect multiple electronic modules 5-1-5-n in different networks, as shown with wiring configuration module 7-1.

In FIG. 4 the mechanical installation structure 3 comprises two power supply slots 12-1, 12-2. The first power supply slot 12-1 is provided just as an example in the upper row of slots in the mechanical installation structure 3. The second power supply slot 12-2 is provided in the lower row of slots in the mechanical installation structure 3.

In the power supply slots 12-1, 12-2 a power supply unit 16-1, 16-2 is installed, respectively. Furthermore, a power bus 14-1, 14-2 comprising two power lines 13-1, 13-2 and 13-3, 13-4 connects the slots 12-1, 12-2 of the respective rows to the respective power supply units 16-1, 16-2. The power bus 14-1 furthermore comprises a protection unit 15 which protects the bus, e.g. from voltage drops or over voltages, in case of a failure of any module connected to the power bus 14-1.

The protection unit 15 is just exemplarily shown in the power supply slot 12-1. In another embodiment the protection unit 15 can be provided as several protection units 15, e.g. one protection unit 15 for each slot.

In another embodiment, single power supply lines can be provided between the power supply slots 12-1, 12-2 and the installation slots 4-1-4-n or the wiring configuration slots 6-1-6-n.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the embodiment in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the embodiment as set forth in the appended claims and their legal equivalents.

What is claimed is:

1. An electronics installation system for an aircraft, comprising:
    a mechanical installation structure comprising:
        a plurality of installation slots, each configured to receive a different electronic module, wherein each electronic module provides aircraft functions for operating the aircraft;
        a first wiring configuration slot configured to receive wiring configuration modules, and a second wiring configuration slot configured to receive wiring configuration modules; and
        a first power supply slot configured to receive a first power supply unit, and a second power supply slot configured to receive a second power supply unit;
    a connection matrix comprising a plurality of data connections, wherein the connection matrix includes at least one data connection between each of the plurality of installation slots and the first wiring configuration slot, at least one redundant data connection between each of the plurality of installation slots and the second wiring configuration slot, at least one data connection between the first wiring configuration slot and the second wiring configuration slot, first power lines configured to connect a first group of the plurality of installation shots to the first power supply slot, and second power lines configured to connect a second group of the plurality of installation slots to the second power supply slot, wherein the first power lines are provided in a first power bus and the second power lines are provided in a second power bus;
    a first wiring configuration module installed in the first wiring configuration slot and coupled to data connections of the first wiring configuration slot, the first wiring configuration module comprising reconfigurable internal interconnection paths providing direct data communication between specific data connections of the first wiring configuration slot, the internal interconnection paths providing data interconnections for direct data transmission between electronic modules installed in the plurality of installation slots, wherein changing the reconfigurable internal interconnection paths of the first wiring configuration module changes a wiring configuration of the plurality of installation slots;
    a second wiring configuration module installed in the second wiring configuration slot and coupled to data connections of the second wiring configuration slot, the second wiring configuration module comprising reconfigurable internal interconnection paths for direct data transmission between the second wiring configuration module and electronic modules installed in the plurality of installation slots, wherein changing the reconfigurable internal interconnection paths of the second wiring configuration module changes the wiring configuration of the plurality of installation slots; and
    at least one protection unit configured to protect electronic modules supplied by the first power bus and electronic modules supplied by the second power bus from failure of any of the electronic modules or failure of any of the wiring configuration modules, by separating a failed electronic module or a failed wiring configuration module from the first power bus and/or the second power bus.

2. The electronics installation system according to claim 1,
    wherein the connection matrix comprises one of a flexible circuit and a printed circuit board; and
    wherein the connection matrix is embedded in the mechanical installation structure.

3. The electronics installation system according to claim 1, wherein the data connections comprises one of an optical fibre connections and electrically conductive connections.

4. The electronics installation system according to claim 1, further comprising:
    a first power supply unit installed in the first power supply slot and coupled to the first power lines, and configured to provide electrical power via the first power lines.

5. An electronics installation system for an aircraft, comprising:
    a mechanical installation structure comprising:
        a plurality of installation slots, each configured to receive a different electronic module, wherein each electronic module provides aircraft functions for operating the aircraft, the plurality of installation slots comprising a first installation slot, a second installation slot, a third installation slot, a fourth installation slot, a fifth installation slot, and a sixth installation slot;
        a first wiring configuration slot configured to receive a first wiring configuration module;
        a second wiring configuration slot configured to receive a second wiring configuration module;
        a first power supply slot configured to receive a first power supply unit for the first installation slot, the second installation slot, the third installation slot, and the fourth installation slot; and
        a second power supply slot configured to receive a second power supply unit for the fifth installation slot, the sixth installation slot, the first wiring configuration slot, and the second wiring configuration slot;
    a connection matrix comprising a first data connection between the first wiring configuration slot and the first installation slot, a second data connection between the first wiring configuration slot and the second installation slot, a third data connection between the first wiring configuration slot and the third installation slot, a fourth data connection between the first wiring configuration slot and the fourth installation slot, a fifth data connection between the first wiring configuration slot and the fifth installation slot, a sixth data connection between the first wiring configuration slot and the second wiring configuration slot, a seventh data connection between the second wiring configuration slot and the first installation slot, an eighth data connection between the second wiring configuration slot and the second installation slot, a ninth data connection between the second wiring configuration slot and the third installation slot, a tenth data connection between the second wiring configuration slot and the fourth installation slot, an eleventh data connection between the second wiring configuration slot and the fifth installation slot, and a twelfth data connection between the second wiring configuration slot and the sixth installation slot;

a first power bus comprising power lines connecting the first power supply slot to the first installation slot, the second installation slot, the third installation slot, and the fourth installation slot;

a second power bus comprising power lines connecting the second power supply slot to the fifth installation slot, the sixth installation slot, the first wiring configuration slot, and the second wiring configuration slot;

a first wiring configuration module installed in the first wiring configuration slot and coupled to data connections of the first wiring configuration slot, the first wiring configuration module comprising a first internal interconnection path that interconnects the first data connection, the third data connection, and the sixth data connection, and the first wiring configuration module further comprising a second internal interconnection path that interconnects the second data connection, the fourth data connection, and the fifth data connection; and a second wiring configuration module installed in the second wiring configuration slot and coupled to data connections of the second wiring configuration slot, the second wiring configuration module comprising a third internal interconnection path that interconnects the sixth data connection and the twelfth data connection.

6. The electronics installation system according to claim 5, further comprising at least one protection unit configured to protect electronic modules supplied by the first power bus and electronic modules supplied by the second power bus from failure of any of the electronic modules or failure of any of the wiring configuration modules, by separating a failed electronic module or a failed wiring configuration module from the first power bus and/or the second power bus.

7. The electronics installation system according to claim 5, wherein the first internal interconnection path and the second internal interconnection path are reconfigurable to change a wiring configuration of installation slots connected to the first wiring configuration module.

8. The electronics installation system according to claim 5, wherein the third internal interconnection path is reconfigurable to change a wiring configuration of installation slots connected to the second wiring configuration module.

9. The electronics installation system according to claim 5, wherein the first internal interconnection path and the second internal interconnection path provide direct data communication between specific data connections of the first wiring configuration slot, and the first and second internal interconnection paths provide data interconnections for direct data transmission between electronic modules installed in installation slots connected to the first wiring configuration module.

* * * * *